United States Patent
Ge (12)

(10) Patent No.: US 11,107,526 B1
(45) Date of Patent: Aug. 31, 2021

(54) CONTROLLING FORMING PROCESS IN RRAM DEVICES USING FEEDBACK CIRCUITS

(71) Applicant: TETRAMEM INC., Newark, CA (US)

(72) Inventor: Ning Ge, Newark, CA (US)

(73) Assignee: TetraMem Inc., Newark, CA (US)

( * ) Notice: Subject to any disclaimer, the term of this patent is extended or adjusted under 35 U.S.C. 154(b) by 0 days.

(21) Appl. No.: 16/795,482

(22) Filed: Feb. 19, 2020

(51) Int. Cl.
| | | |
|---|---|---|
| G11C 11/00 | (2006.01) | |
| G11C 13/00 | (2006.01) | |
| H01L 27/24 | (2006.01) | |
| H01L 45/00 | (2006.01) | |

(52) U.S. Cl.
CPC ...... *G11C 13/0007* (2013.01); *G11C 13/0038* (2013.01); *G11C 13/0069* (2013.01); *G11C 13/0097* (2013.01); *H01L 27/2436* (2013.01); *H01L 45/08* (2013.01); *H01L 45/1233* (2013.01); *H01L 45/1253* (2013.01); *H01L 45/146* (2013.01); *G11C 2213/32* (2013.01); *G11C 2213/52* (2013.01)

(58) Field of Classification Search
CPC ............ G11C 13/0007; G11C 13/0038; G11C 13/0069; G11C 13/0097; G11C 2213/32; G11C 2213/52; H01L 27/2436; H01L 45/08; H01L 45/1233; H01L 45/1253; H01L 45/146

USPC ........................................................ 365/148
See application file for complete search history.

(56) References Cited

U.S. PATENT DOCUMENTS

2013/0250657 A1*  9/2013  Haukness .......... G11C 13/0069
                                                               365/148

* cited by examiner

*Primary Examiner* — Huan Hoang
(74) *Attorney, Agent, or Firm* — MagStone Law LLP

(57) ABSTRACT

Technologies relating to controlling forming process in RRAM devices implemented in a cross-bar circuit using one or more feedback circuits are disclosed. An example apparatus includes an RRAM cell configured to form a channel; a MOSFET having a drain terminal, a source terminal, and a gate terminal, wherein the MOSFET is connected to the RRAM cell via the drain terminal; a TIA connected to the MOSFET via the source terminal; a first signal generator connected to the RRAM cell; a second signal generator connected to the MOSFET via the gate terminal; and a comparator having a first input end, a second input end, and an output end, wherein the comparator is connected to the TIA via the first input end, the second input end is connected to a reference voltage source, and the output end is connected to the first signal generator and the second signal generator.

15 Claims, 4 Drawing Sheets

CONTROLLING FORMING PROCESS IN RRAM DEVICES USING FEEDBACK CIRCUITS

TECHNICAL FIELD

The present disclosure generally related to feedback circuits and more specifically to controlling forming process in RRAM devices implemented in a cross-bar circuit using one or more feedback circuits.

BACKGROUND

Conventionally, a crossbar array circuit may include horizontal metal wire rows and vertical metal wire columns (or other electrodes) intersecting with each other, with crossbar devices formed at the intersecting points. The crossbar array may be used in non-volatile solid-state memory, signal processing, control systems, high-speed image processing, neural network, and other applications.

An RRAM is a two-terminal passive device that is capable of changing resistance upon sufficient electrical stimulations, which have attracted significant attention for high-performance nonvolatile memory applications. The resistance of the RRAM may be electrically switched between two states: a High-Resistance State (HRS) and a Low-Resistance State (LRS). The switching event from FIRS to LRS is called "Set" or "On" switching process. Conversely, the switching from LRS to FIRS is called "Reset" or "Off" switching process.

To enable a RRAM device to switch between these two resistance states, a forming process may be use. The forming process may form a channel or a filament in a RRAM device that provides switching characteristics. The forming can be done by applying a voltage or a current to the RRAM device; the forming voltage or current is usually much higher than the reading voltage or the writing voltage.

The forming process, however, remains technically challenging due to the need for greater control. If the forming voltage or current is too high, the RRAM device transitions into an overly-conductive state, causing difficulties to a subsequent RESET process. On the contrary, if the forming voltage or current is too low, the forming process will likely be unsuccessful.

Further, because a forming process is a self-accelerating; over-forming may occur in a few nanoseconds. It raises challenges to the traditional open-loop forming method, and fast closed-loop control is preferred.

SUMMARY

Technologies relating to controlling forming process in RRAM devices implemented in a crossbar circuit using one or more feedback circuits are disclosed.

An apparatus, in some implementations, includes an RRAM cell configured to form a channel; a MOSFET having a drain terminal, a source terminal, and a gate terminal, wherein the MOSFET is connected to the RRAM cell via the drain terminal; a TIA connected to the MOSFET via the source terminal; a first signal generator connected to the RRAM cell; a second signal generator connected to the MOSFET via the gate terminal; and a comparator having a first input end, a second input end, and an output end, wherein the comparator is connected to the TIA via the first input end, the second input end is connected to a reference voltage source, and the output end is connected to the first signal generator and the second signal generator.

The comparator is, in some implementations, a voltage comparator. The comparator is, in some implementations, configured to switch off the first signal generator when the channel is formed.

The first signal generator, in some implementations, includes a DC ramping signal generator or a pulse ramping signal generator.

In some implementations, the second signal generator includes a DC ramping signal generator. In some implementations, the second signal generator is configured to be used for current compliance.

A combination of the TIA and the comparator, in some implementations, has a propagation delay that is less than 1 nanosecond. The combination of the TIA and the comparator is, in some implementations, configured to be operated up to 40 GHz.

In some implementations, the reference voltage source is configured to provide a reference voltage Vref, and the TIA is configured to output a TIA output voltage Vo, and wherein when the channel is formed, Vo<Vref, and when the channel is not formed, Vo>Vref.

The RRAM cell, in some implementations, further includes a bottom electrode, a channel forming layer formed on the bottom electrode, a top electrode formed on the channel forming layer, wherein the channel forming layer is configured to form the channel.

The RRAM cell, in some implementations, further includes a bit line formed under the bottom electrode, and a word line formed on the top electrode.

In some implementations, the bottom electrode or the top electrode is made of one of: Pt, Ti, TiN, Pd, Ir, W, Ta, Hf, Nb, V, TaN, NbN, or a combination thereof, or an alloy of Pt, Ti, TiN, Pd, Ir, W, Ta, Hf, Nb, V, TaN, NbN, and one or more other electrically conductive materials.

In some implementations, a material of the channel forming layer is made of one of: TaOx (where x≤2.5), HfOx (where x≤2.0), TiOx (where x≤2.0), or a combination thereof.

In some implementations, the channel includes an oxygen vacancy filament. The channel is, in some implementations, made of one of: Ta-rich, Hf-rich, or Ti-rich oxide material.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to controlling forming process in RRAM devices implemented in a crossbar circuit using one or more feedback circuits is disclosed. The disclosed technologies may provide the following technical advantages.

First, the disclosed technologies provide greater control in an RRAM channel forming process. Conventional RRAM channel forming processes provide insufficient control: the forming energy may be either too intense or too weak to form a channel well. Feedback circuits described in the present disclosure render the forming voltage or current more manageable and automatically stops the forming process, after a channel is appropriately formed. The disclosed technologies, therefore, reduce or eliminate over-forming and may be fully automatic.

Second, the disclosed technologies involve using a Trans-Impedance Amplifier (TIA) with a comparator, the combination of which can reduce delay to less than 1 ns delay (or increase frequency to 40 GHz), while still maintaining low power consumption. A RRAM crossbar array circuit can also be trained faster and with more accuracy, increasing the crossbar array circuit's performance significantly. The improved performance is ideal for implementing crossbar array circuits in such application as real-time image recognition, neural computing, in-memory computing, or other related applications.

Third, a ramping signal generator implemented using the disclosed technologies provides a scalable solution can reduce costs and area size of a RRAM crossbar array circuit. The ramping signal generators may be shared by several word-lines and select-lines, and the TIAs that already exist at each bit line's output end may be used to provide additional functionalities, such as a feedback function.

Figures 1A, 1B:
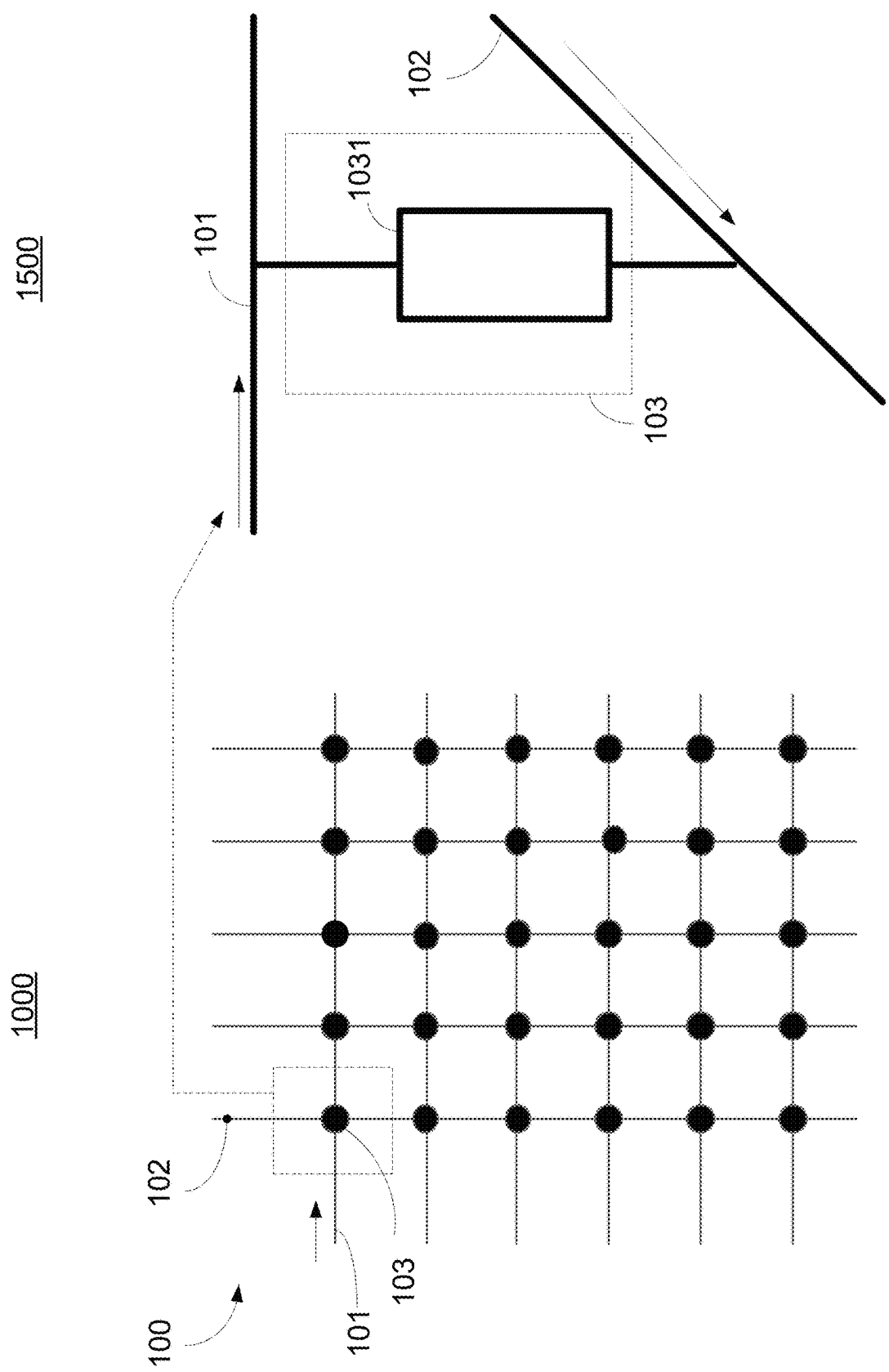
FIG. 1A is a block diagram illustrating an example crossbar array circuit in accordance with some implementations of the present disclosure.
FIG. 1B is a block diagram illustrating a partially enlarged view of an example cross-point device shown in FIG. 1A in accordance with some implementations of the present disclosure.

FIG. 1A is a block diagram 1000 illustrating an example crossbar array circuit 100 in accordance with some implementations of the present disclosure. As shown in FIG. 1A, the crossbar array circuit 100 includes a first word line 101, a first bit line 102, and a cross-point device 103.

FIG. 1B shows a block diagram 1500 illustrating a partially enlarged view of the cross-point device 103 shown in FIG. 1A in accordance with some implementations of the present disclosure. As shown in FIG. 1B, the cross-point device 103 is positioned between and connected with the first word line 101 and the first bit line 102 of the crossbar array circuit 100 shown in FIG. 1A.

In some implementations, the cross-point device 103 includes an RRAM cell 1031. The RRAM cell 1031 may be a one-Transistor-one-memRistor (1T1R) stack, one-Selector-one-memRistor (1S1R), or a memristor.

Figure 2:
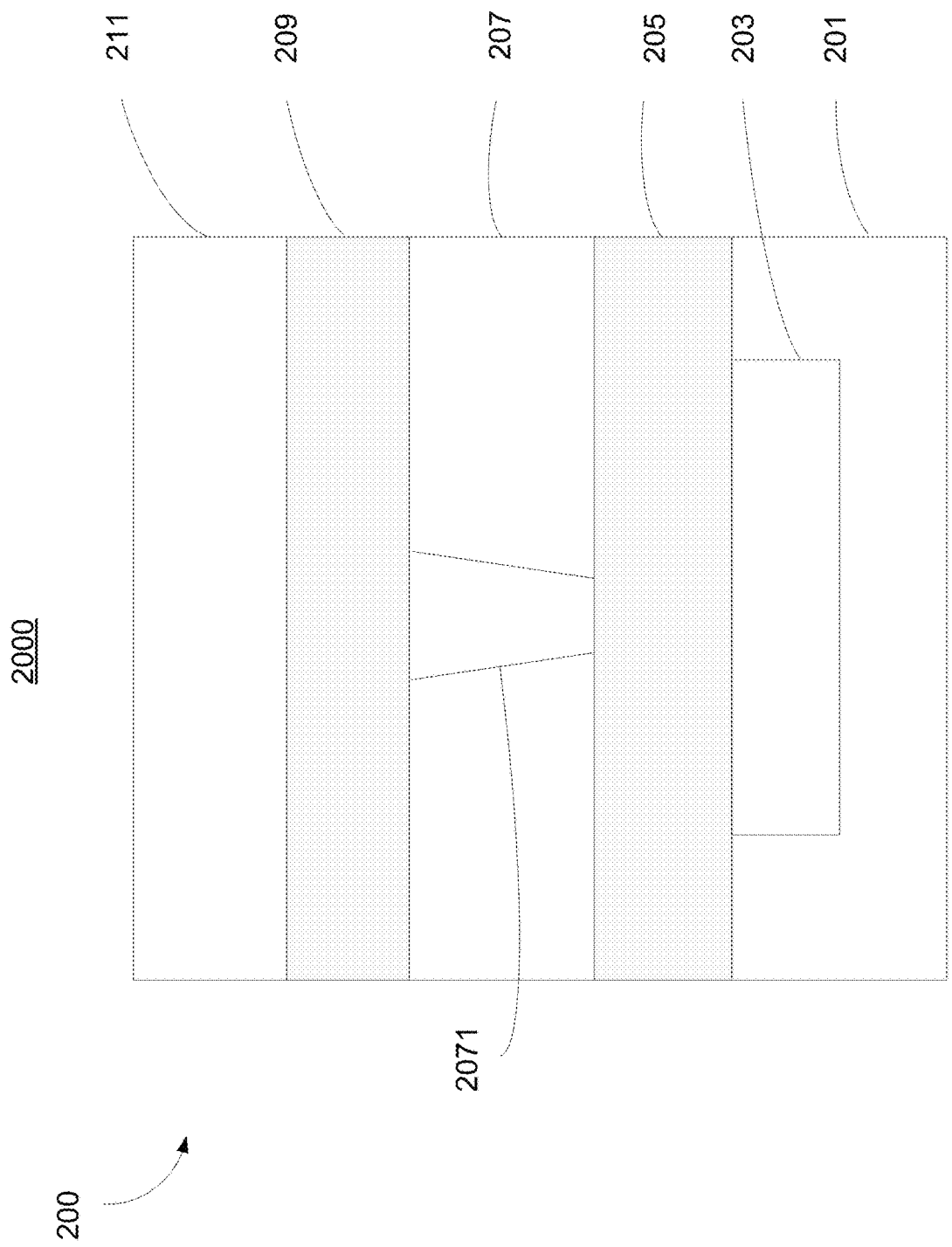
FIG. 2 is a block diagram illustrating an RRAM cell in accordance with some implementations of the present disclosure.

FIG. 2 is a block diagram 2000 illustrating an RRAM cell 200 in accordance with some implementations of the present disclosure.

As shown in FIG. 2, the RRAM cell 200 includes a substrate 201, a bit line 203 formed on the substrate 201, a bottom electrode 205 formed on the bit line 203, a channel forming layer 207 formed on the bottom electrode 205, a top electrode 209 formed on the channel forming layer 207, and a word line 211 formed on the top electrode 209.

The substrate 301 is, in some implementations, made of Si, SiN, $SiO_2$, $Al_2O_3$, or a combination thereof. The bit line 203 is, in some implementations, made of Ag, Al, Au, Cu, Fe, Ni, Mo, Pt, Pb, Ti, TiN, Sn, W, Zn, a combination thereof, or an alloy of Ag, Al, Au, Cu, Fe, Ni, Mo, Pt, Pb, Ti, TiN, Sn, W, Zn, and one or more other electrically conductive materials.

The word line 211 is, in some implementations, made of Ag, Al, Au, Cu, Fe, Ni, Mo, Pt, Pb, Ti, TiN, Sn, W, Zn, a combination thereof, or an alloy of Ag, Al, Au, Cu, Fe, Ni, Mo, Pt, Pb, Ti, TiN, Sn, W, Zn, and one or more other electrically conductive materials.

In some implementations, a material of the bottom electrode 205 and/or the top electrode 209 includes Pt, Ti, TiN, Pd, Ir, W, Ta, Hf, Nb, V, TaN, NbN, or any combination or alloy of other electrically conductive materials thereof.

The bottom electrode 205 is, in some implementations, made of Pt, Ti, TiN, Pd, Ir, W, Ta, Hf, Nb, V, TaN, NbN, a combination thereof, or an alloy of Pt, Ti, TiN, Pd, Ir, W, Ta, Hf, Nb, V, TaN, NbN, and one or more other electrically conductive materials.

The top electrode 209 is, in some implementations, made of Pt, Ti, TiN, Pd, Ir, W, Ta, Hf, Nb, V, TaN, NbN, a combination thereof, or an alloy of Pt, Ti, TiN, Pd, Ir, W, Ta, Hf, Nb, V, TaN, NbN, and one or more other electrically conductive materials.

The channel forming layer 207 is, in some implementations, made of $TaO_x$ (where x≤2.5), $HfO_x$ (where x≤2.0), $TiO_x$ (where x≤2.0), and a combination thereof.

In some implementations, the channel forming layer 207 is configured to form a filament or a channel 2071 within the channel forming layer 207, in response to a forming voltage or current being applied to the RRAM cell 200.

The channel or the filament 2071 may include an oxygen vacancy filament. The channel or the filament 2071 is, in some implementations, made of Ta-rich, Hf-rich, or Ti-rich oxide materials.

As explained above, when the forming voltage or current is too high, the resistance of the channel may be kept too low. To the contrary, when the forming voltage or current is too low, the forming may not be successful, and the channel may not be formed correctly.

Furthermore, during an optimal forming process, the forming voltage or current stops immediately (e.g., within a few nanoseconds or even picoseconds) after a channel is formed. A conventional forming process is often not optimal: because the forming process is a self-accelerating. For instance, a higher voltage/current causes stronger forming, and the forming process makes a device become more conductive; a more conductive device, in turn, produce even greater current, which intensifies the forming behavior.

Thus, if a forming process does not stop immediately after a channel is formed, over-forming may result. Technologies that stop a forming process immediately in response to detecing that a channel has been formed is thus technically advantageous.

Figure 3:
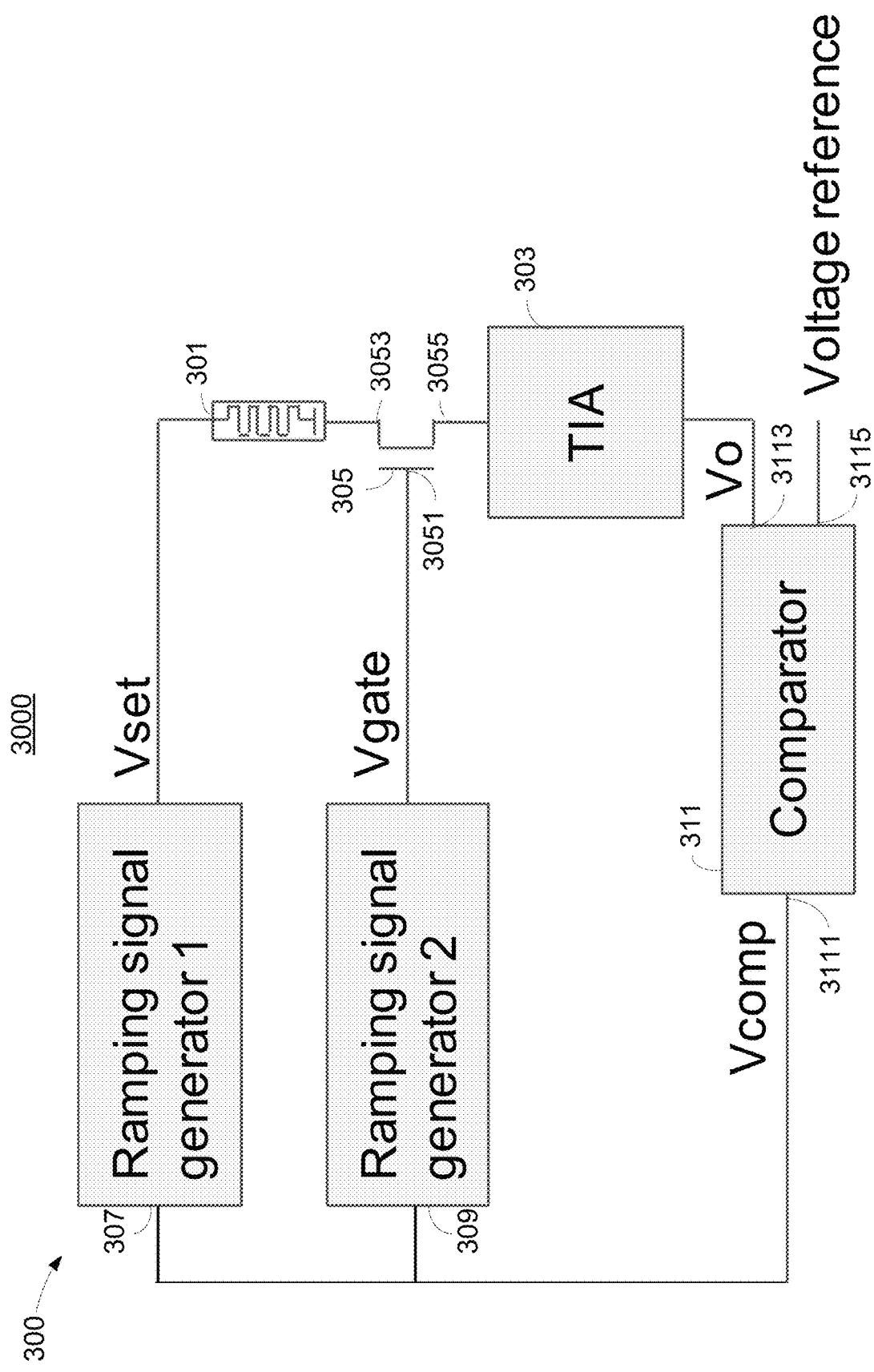
FIG. 3 is a block diagram illustrating a feedback circuit in accordance with some implementations of the present disclosure.

FIG. 3 is a block diagram 3000 illustrating a feedback circuit 300 in accordance with some implementations of the present disclosure.

As shown in FIG. 3, the feedback circuit 300 includes a RRAM cell 301, a MOSFET 305 connected to the RRAM cell 301, a TIA 303 connected to the MOSFET 305, a comparator 311 connected to the TIA 303, a first signal generator 307 connected to the RRAM cell 301, and a second signal generator 309 connected to the MOSFET 305.

The MOSFET 305, in some implementations, includes a first terminal 3051 connected to the second signal generator 309, a second terminal 3053 connected to the RRAM cell 301, and a third terminal 3055 connected to the TIA 303.

In some implementations, the first terminal 3051 is a gate terminal; the second terminal 3053 is a drain terminal; and the third terminal 3055 is a source terminal. The first terminal 3051 is connected to the second signal generator 309; the second terminal 3053 is connected to the RRAM cell 301; and the third terminal 3055 is connected to the TIA 303.

The first signal generator 307 is, in some implementations, configured to provide a $V_{set}$ to the RRAM cell 301; the second signal generator 309 is, in some implementations, configured to provides a $V_{gate}$ to the first terminal 3051 of the MOSFET 305. The first signal generator 307 may include a DC ramping signal generator or a pulse ramping signal generator.

The second signal generator 309 may include a ramping signal generator. The second signal generator 309 and the MOSFET 305 may be implemented to provide current compliance. This architecture is capable of gradually increasing the maximum current passing through the MOSFET 305 during the saturation mode.

In some implementations, the TIA 303, the comparator 311, or both, has a propagation delay that is less than 1 nanosecond. In some implementations, the combination of the TIA 303 and the comparator 311 has a propagation delay that is less than 1 nanosecond.

The comparator 311 may include a first input end 3113, a second input end 3115, and an output end 3111. The output end 3111 is connected to the first signal generator 307 and the second signal generator 309.

In some implementations, the comparator 311 includes a voltage comparator. A current comparator may have greater delay and higher power consumption than a voltage comparator. The comparator 311 is configured to compare a TIA output voltage Vo from TIA 303 with a Vref from a reference voltage source. In some implementations, a reference voltage Vref may be pre-determined as ½ ($V_o$ high+$V_o$ low). If the $V_o$ is higher than $V_{ref}$, then the output end 3111 will be 1. If the $V_o$ is lower than the $V_{ref}$, then the output end 3111 will be 0. This allows the comparator 311 to switch on and off both the first signal generator 307 and the second signal generator 309. The details of these signals are discussed with reference to FIG. 4.

Figure 4:
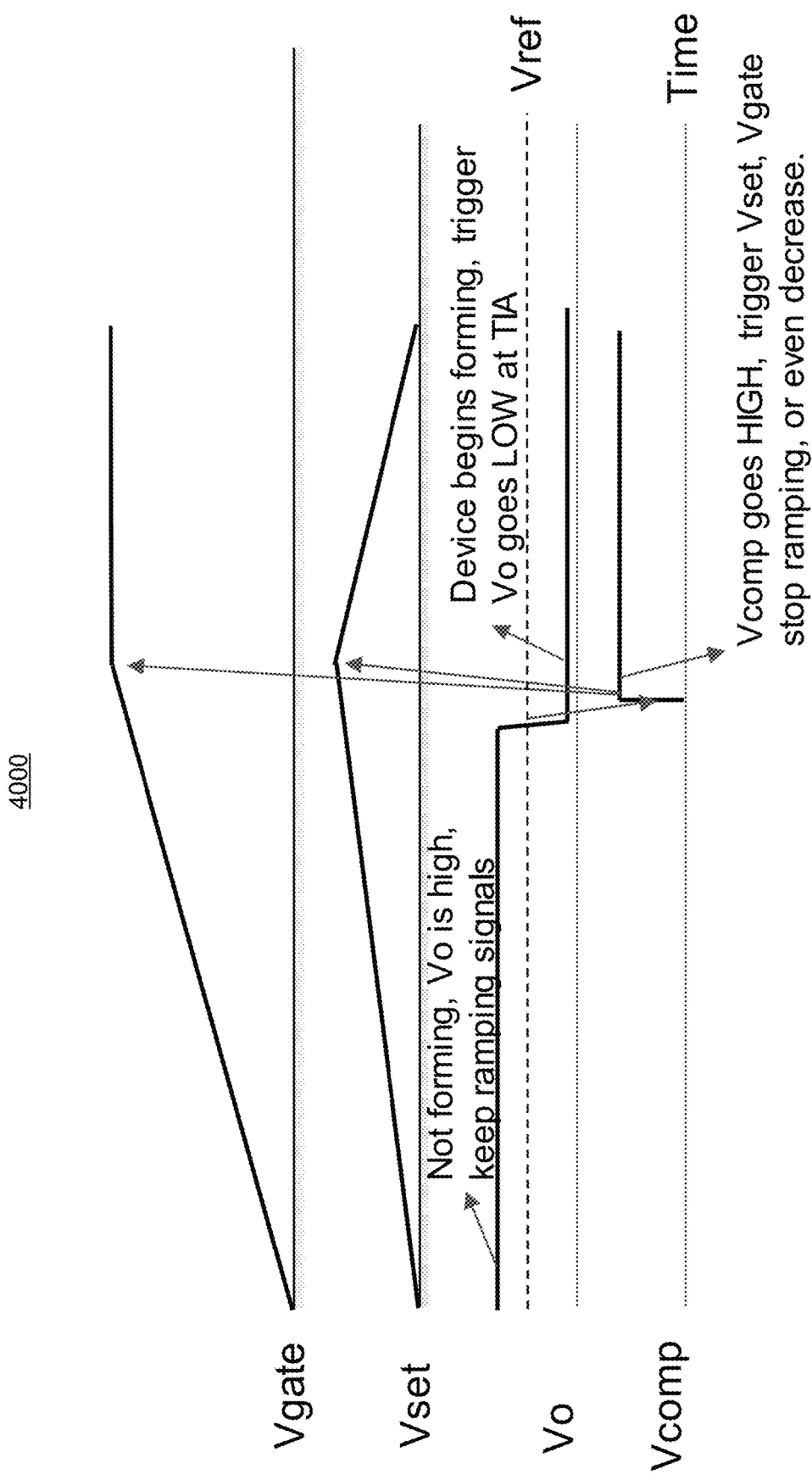
FIG. 4 is a timing diagram illustrating various characteristic of an example feedback circuit in accordance with some implementations of the present disclosure.

FIG. 4 is timing diagram 4000 illustrating various characteristic of the feedback circuit 300 in accordance with some implementations of the present disclosure.

As shown in FIG. 4, when the first signal generator 307 provides a ramping signal $V_{set}$ to the RRAM cell 301, energy or (heat) may gradually accumulates in the RRAM cell 301, causing a channel (or a filament) to form within the RRAM cell 301. Another ramping signal $V_{gate}$ provided by the second signal generator 309 may be used as current compliance, which increases the maximum current flows through both the RRAM cell 301 and the MOSFET 305.

$V_o$ may be an output voltage of the TIA 303. The current output from the MOSFET 305 may be converted into $V_o$. $V_o$ remains high, when the first signal generator 307 starts ramping and before a channel is formed. Once a channel is formed, the $V_o$ reduces, which causes the $V_{comp}$ to increase. The comparator 311 then switches its digital output (e.g., from 0 to 1) by turning off the first signal generator 307 and the second signal generator 309. In some implementations, when the first signal generator 307 is switched off, the ramping voltage $V_{set}$ may be reduced so that the channel forming process can stop as needed.

The use of a TIA and a comparator in these ways produces a faster response, reducing the delay to less than 1 nanosecond. Frequencies as high 40 GHz may be provided with lower power consumption. The feedback circuit 300 may be used for rapid array forming tests, because the ramping signal generators can be shared for different word lines and select lines; existing TIAs (located at the output end of each bit line) may also be reused to provide feedback. These technologies enable the feedback circuit to have better scalability and flexibility.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
an Resistive Random-Access Memory (RRAM) cell configured to form a channel;
a MOSFET having a drain terminal, a source terminal, and a gate terminal, wherein the Metal-Oxide-Semiconductor Field Effect Transistor (MOSFET) is connected to the RRAM cell via the drain terminal;
a Trans-Impedance Amplifier (TIA) connected to the MOSFET via the source terminal;
a first signal generator connected to the RRAM cell;
a second signal generator connected to the MOSFET via the gate terminal; and
a comparator having a first input end, a second input end, and an output end, wherein the comparator is connected to the TIA via the first input end, the second input end is connected to a reference voltage source, and the output end is connected to the first signal generator and the second signal generator.

2. The apparatus as claimed in claim 1, wherein the comparator is a voltage comparator.

3. The apparatus as claimed in claim 1, wherein the comparator is configured to switch off the first signal generator when the channel is formed.

4. The apparatus as claimed in claim 1, wherein the first signal generator comprises a DC ramping signal generator or a pulse ramping signal generator.

5. The apparatus as claimed in claim 1, wherein the second signal generator comprises a DC ramping signal generator.

6. The apparatus as claimed in claim 1, wherein the second signal generator is configured to be used for current compliance.

7. The apparatus as claimed in claim 1, wherein a combination of the TIA and the comparator has a propagation delay that is smaller than 1 nanosecond.

8. The apparatus as claimed in claim 1, wherein a combination of the TIA and the comparator is configured to be operated up to 40 GHz.

9. The apparatus as claimed in claim 1, wherein the reference voltage source is configured to provide a reference voltage Vref, and the TIA is configured to output a TIA output voltage Vo, and wherein when the channel is formed, Vo<Vref, and when the channel is not formed, Vo>Vref.

10. The apparatus as claimed in claim 1, wherein the RRAM cell comprises a bottom electrode, a channel forming layer formed on the bottom electrode, a top electrode formed on the channel forming layer, wherein the channel forming layer is configured to form the channel.

11. The apparatus as claimed in claim 10, wherein the RRAM cell further comprises a bit line formed under the bottom electrode, and a word line formed on the top electrode.

12. The apparatus as claimed in claim 10, wherein a material of the bottom electrode or the top electrode comprises Pt, Ti, TiN, Pd, Ir, W, Ta, Hf, Nb, V, TaN, NbN, or any combination or alloy of other electrically conductive materials thereof.

13. The apparatus as claimed in claim 10, wherein a material of the channel forming layer comprises TaOx (where x≤2.5), HfOx (where x≤2.0), TiOx (where x≤2.0), or the combination thereof.

14. The apparatus as claimed in claim 10, wherein the channel comprises an oxygen vacancy filament.

15. The apparatus as claimed in claim 10, wherein a material of the channel comprises Ta-rich, Hf-rich, or Ti-rich oxide material.

* * * * *